United States Patent

Dreiske et al.

[11] Patent Number: 5,846,850
[45] Date of Patent: Dec. 8, 1998

[54] DOUBLE SIDED INTERDIFFUSION PROCESS AND STRUCTURE FOR A DOUBLE LAYER HETEROJUNCTION FOCAL PLANE ARRAY

[75] Inventors: Peter D. Dreiske; Chang-Feng Wan, both of Dallas, Tex.

[73] Assignee: Raytheon TI Systems, Inc., Lewisville, Tex.

[21] Appl. No.: 706,583

[22] Filed: Sep. 5, 1996

Related U.S. Application Data

[60] Provisional application No. 60/003,320 Sep. 5, 1995.
[51] Int. Cl.⁶ .................................................. H01L 31/18
[52] U.S. Cl. ................................................. 438/67; 438/87
[58] Field of Search .......................... 437/3, 5, 247, 437/974, 225; 250/338.4, 370.13, 332; 257/442, 444; 438/87

[56] References Cited

U.S. PATENT DOCUMENTS

| | | | |
|---|---|---|---|
| 4,736,104 | 4/1988 | Teherani et al. | 250/370 |
| 5,144,138 | 9/1992 | Kinch et al. | 437/5 |
| 5,182,217 | 1/1993 | Norton | 437/3 |
| 5,273,910 | 12/1993 | Tran et al. | 437/5 |
| 5,279,974 | 1/1994 | Walsh | 437/3 |
| 5,308,980 | 5/1994 | Barton | 437/5 |
| 5,380,669 | 1/1995 | Norton | 437/5 |
| 5,401,986 | 3/1995 | Cockrum et al. | 257/188 |
| 5,462,882 | 10/1995 | Chisholm et al. | 437/5 |
| 5,470,761 | 11/1995 | McKee et al. | 437/5 |
| 5,536,680 | 7/1996 | Ehmke | 437/3 |

FOREIGN PATENT DOCUMENTS

| | | | |
|---|---|---|---|
| 1-223779 | 9/1989 | Japan | 257/442 |
| WO94/17 | 8/1994 | WIPO | 257/444 |

*Primary Examiner*—John Niebling
*Assistant Examiner*—S. Mulpuri
*Attorney, Agent, or Firm*—Baker & Botts, L.L.P.

[57] ABSTRACT

This invention relates to a process and structure for performing a high temperature or other process on both sides of a thin slice of material or die prior to being placed onto a integrated circuit or multi-chip module. In a particular embodiment, a process and structure is given to provide for double sided interdiffusion for passivation of a Mercury Cadmium Telluride (MCT) film which is mounted to a read-out integrated circuit (ROIC) face side up in order to fabricate vertically integrated Focal Plane Arrays (FPAs) with reduced dark currents and improved performance. The process of the present invention also allows for the insertion of novel materials such as Double Layer Heterojunction (DLHJ), MBE, MOCVD, etc. in the vertical integrated approach to FPAs.

10 Claims, 1 Drawing Sheet

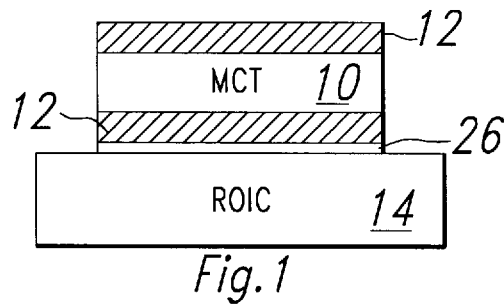
Fig.1
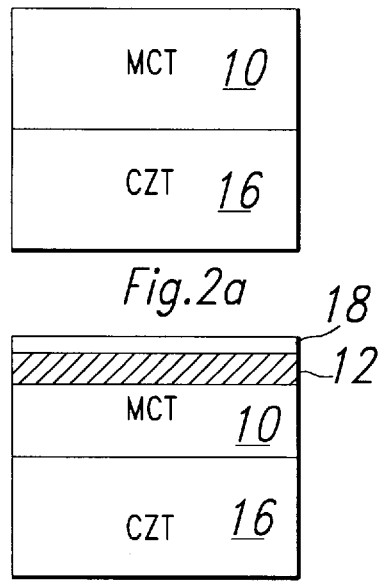
Fig.2a
Fig.2b
Fig.2c
Fig.2d
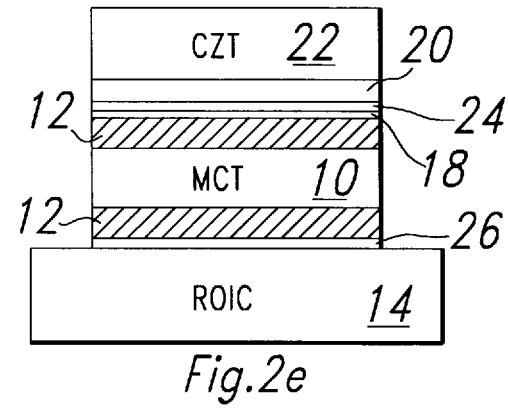
Fig.2e
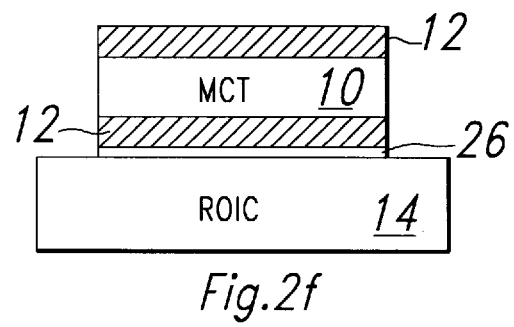
Fig.2f

DOUBLE SIDED INTERDIFFUSION PROCESS AND STRUCTURE FOR A DOUBLE LAYER HETEROJUNCTION FOCAL PLANE ARRAY

This application claims priority under 35 U.S.C. § 119 (e)(1) of provisional application number 60/003,320, filed Sep. 5, 1995.

CROSS-REFERENCES TO RELATED APPLICATIONS

The following concurrently filed application is related to the instant application 08/707,815.

FIELD OF THE INVENTION

This invention generally relates to a process and structure for performing a high temperature or other process on both sides of a material film prior to being placed onto a integrated circuit wafer or chip. More particularly, it relates to fabrication of Focal Plane Arrays (FPAs) used in digital imaging systems. In a particular embodiment, a process and structure is given to provide for double sided interdiffusion for passivation of a Mercury Cadmium Telluride (MCT) film which is mounted to a read-out integrated circuit (ROIC) face side up. The process of the present invention also allows for the insertion of novel materials such as Double Layer Heterojunction (DLHJ), MBE, MOCVD, etc. in the vertical integrated approach to FPAs.

BACKGROUND OF THE INVENTION

Digital imaging systems employ focal plane arrays to sense image information. One important class of focal plane arrays is infrared sensing arrays. These arrays are useful for image detection and motion sensing. Infrared arrays detect infrared radiation that is given off by virtually all objects, including the detector array's components, in proportion to the objects temperature. In order to maximize system sensitivity and minimized noise, thereby maximizing signal to noise ratio, it is common to cool infrared sensing focal plane arrays to cryogenic temperatures in order to minimize system induced noise in detected images and to prevent system component emissions from swamping desired low intensity images.

Different semiconductor materials are inherently sensitive to different portions of the electromagnetic spectrum as a result of their molecular energy band structure. Indium antimonide (InSb) and Mercury Cadmium Telluride (HgCdTe or MCT) are well known materials which are suitable for the detection of infrared radiation. While these materials are suited for infrared detection, they are not suitable for the formation of integrated circuits or other electronics to process the image information which is collected by the FPA formed on these materials. Consequently, it is the standard practice in the infrared sensing art to connect an infrared sensor from one of these materials to silicon-based integrated circuits for processing of the image information produced from the infrared sensor. Thus the sensors are fabricated separately from the readout circuits and then mounted to a common substrate or circuit board. Alternatively, the sensors are fabricated on a piece of sensor material that has been mounted to the readout integrated circuit substrate.

One approach to fabricating FPAs for infrared digital imaging systems has been to create an array of p-n junction or heterojunction diodes that convert photons of a range of infrared frequencies into electronic signals to perform as optical detectors. Each diode in the array then defines a pixel within the photodetector array. These diodes are typically reversed biased and generate a current flow in proportion to the number of photons that strike the diode having a frequency which matches or exceeds the band gap energy of the infrared material used to fabricate the diodes. The current flow for each diode can be monitored and processed to provide a digital image corresponding to the infrared energy incident to the diode array.

The diodes in the array are each formed as a junction of n-type and p-type semiconductor materials which define receptor regions for each photodetector. The materials used to fabricate the infrared detectors or photo diodes are typically semiconductors having elements from Group II and Group VI of the periodic table, such as mercury cadmium telluride (MCT). Using these materials, detectors have been used which operate in the lower infrared frequency band down to the limits of the available long wave length atmospheric window, i.e., at wavelengths of 8–12 microns. The detection of such long wavelength radiation, if it is to be done at only moderate cryogenic temperatures, e.g. at liquid nitrogen rather than liquid helium temperatures, is preferably done using a very narrow bandgap semiconductor such as MCT. Compositions of MCT having a selectable bandgap energy may be specified by varying the proportions of mercury and cadmium in the composition $Hg_{1-x}Cd_xTe$, hereinafter referred to generally as MCT.

In the formation of these photodetectors it is important to include a protective layer such as cadmium telluride (CdTe) on the MCT wafer to act as a passivation layer, and as an insulator for conductive interconnect lines. Passivation of MCT during detector fabrication has been found to reduce dark currents arising from surface states. Dark currents are spurious currents which flow despite the complete lack of infrared light at the frequencies the detector is designed to detect. Dark currents thus are error currents or leakage currents across the junction of the diodes. They are caused by imperfections in the bulk or surface of the MCT. Dark currents which occur at the surface of the MCT are particularly troublesome. Dangling bonds at surfaces can contribute to surface imperfections which alter the electrical characteristics of the detectors, such as, the photocarrier lifetimes and surface recombination velocity. Other imperfections include extrinsic and intrinsic impurities, or dislocations of the MCT.

The surface imperfections and the resulting dark currents can be reduced by application and interdiffusion of a passivation layer. Cadmium telluride (CdTe) has generally been used as the passivating material in the prior art. The CdTe is deposited on the MCT and heated to about 300° C. for several hours. The mercury then diffuses into the CdTe and the cadmium diffuses into the MCT to provide a graded rather than definite interface. Interdiffusion of the CdTe layer and the MCT layer eliminates the dangling bonds of the MCT layer and diffuses any remaining impurities away from the MCT surface.

Embodiments of the present invention are directed to the topside illuminated, or Vertically Integrated Photodiode (VIP) approach for fabricating FPAs. In this approach, a slice of group II and/or group VI elements such as MCT is epoxy mounted to a Read Out IC (ROIC). A ROIC is typically a silicon chip which has contact pads for each pixel of the detector array prefabricated on the silicon, in addition to circuitry for monitoring and processing the output of the photodiode detector array. After the diodes are formed on the MCT slice, the diodes are connected to the ROIC by etching vias to connect each diode to a corresponding contact pad on the ROIC with metal leads. This process in described in U.S. Pat. No. 4,720,738 issued to Arturo Simmons and incorporated herein by reference.

SUMMARY OF THE INVENTION

The benefits of passivation of MCT for FPA detectors with materials such as CdTe have been known, see for example U.S. Ser. No. 08/137,874 filed by Wan et. al and assigned to Texas Instruments Inc. However, since interdiffusion must be done at relatively high temperatures, interdiffusion poses problems for vertically integrated FPA structures. Specifically, the temperatures required for interdiffusion are too high for a MCT structure which has been epoxy mounted to a ROIC for a topside illuminated approach to infrared FPAs due to the mismatch in thermal expansion of the silicon ROIC compared to the MCT. Because of its thin width compared to the ROIC, the MCT is sometimes not able to withstand the stress causing dislocations or fractures of the MCT. Therefore, the interdiffusion is preferably performed prior to mounting the MCT. Prior to the present invention, this approach to building FPAs could not derive the benefits of interdiffusion of the frontside CdTe passivation layer and has suffered in performance due to dark currents.

In accordance with the present invention, an improved method and structure is provided for an epoxy mounted MCT to an ROIC to implement a focal plane array. The method and structure includes double layer heterojunction diodes with topside interdiffusion of the CdTe passivation layer on the upper MCT surface as well interdiffusion of the lower MCT surface with a lower passivation layer. The interdiffusions are done prior to epoxy mounting the MCT to the ROIC to avoid the temperature problems discussed above.

In one embodiment, a layer of MCT is grown by Liquid Phase Epitaxy (LPE) on a cadmium zinc telluride (CZT) substrate. After preparation of the top surface of the MCT, the MCT is passivated by deposition of CdTe. A second CZT is mounted with a high temperature adhesive on the passivated surface of the MCT. The first CZT is then removed and the bottom of the MCT is passivated by deposition of CdTe. The stack is then placed in an annealing furnace, such that both top and bottom CdTe films are interdiffused into the MCT. The MCT which has now been passivated on both sides is prepared to be mounted to the ROIC by sawing it to the proper size. The MCT is epoxy mounted to the ROIC and the second CZT and the high temperature epoxy are removed. This embodiment procedure creates a double side passivated MCT mounted on a ROIC where the interdiffusion passivation is done prior to the mounting on the ROIC.

In another embodiment, a process and structure is described to provide a single side passivated MCT mounted on a ROIC where the interdiffusion passivation is done prior to the mounting on the ROIC. This method has the advantage of reduced processing steps and does not require the high temperature bond for the MCT to the second carrier. This method would be especially useful when the diffusion regions of the diodes fabricated on the MCT do not extend to the bottom of the MCT layer. When the p-n junctions of the diodes "punch through" the MCT, extend fully through the MCT layer, this method may not adequately limit dark currents as discussed above due to the back side of the MCT and its associated p-n junction not being passivated. This method is generally less desirable because diodes which don't extend through the MCT have an increased junction area which tends to increase dark currents.

In this second embodiment, a layer of MCT is grown by Liquid Phase Epitaxy (LPE) on a cadmium zinc telluride (CZT) substrate. After preparation of the top surface of the MCT, the MCT is passivated by deposition of CdTe. In this embodiment, the MCT may be interdiffused prior to being mounted to the second carrier. The second carrier can be chosen for the MCT independent of temperature concerns such as coefficient of thermal expansion and high temperature epoxy, because the MCT interdiffusion has already taken place. The first CZT is then removed. The MCT which has now been passivated on only one side is prepared to be mounted to the ROIC by sawing it to the proper size. The MCT is epoxy mounted to the ROIC and the second CZT and the epoxy are removed.

An advantage of the present invention is the MCT is processed before it is mounted to the ROIC or wafer. This allows for processing the MCT to the proper thickness without subjecting the ROIC to these processes. It also allows the MCT to be diffused on both sides without the problems discussed above for materials with mismatched coefficient of expansion.

An additional advantage of the present invention is the process also allows the MCT to be mounted with either side up. This would, for example allow for the use of DLHJ, MOCVD, or MBE capped to the MCT in vertical integrated FPAs which use a MCT diode array which is epoxy mounted to a ROIC.

A further advantage of the present invention is that it allows the use of existing mounting technology of the MCT to the ROIC. This allows the method of the present invention to be integrated into the existing process flow for increased control of dark currents with minimal changes to process flow subsequent to mounting the MCT to the ROIC.

This is apparently the first use of a method to provide double sided passivation of a MCT layer which can then be epoxy mounted to an ROIC to implement a focal plane array. This is also apparently the first use of double sided interdiffusion of CdTe on a MCT layer as described above.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

FIG. 1 shows a preferred embodiment of the present invention having double sided interdiffusion of MCT mounted to a ROIC; and FIGS. 2a–2f shows a sequence of processing steps for a method of fabricating a MCT structure according to the present invention.

DETAILED DESCRIPTION OF THE PREFERRED EMBODIMENTS

The preferred embodiment of the present invention is best understood by referring to FIGS. 1–2 of the drawings, like numerals are used for like and corresponding parts of the various drawings.

With reference to FIG. 1, there is shown a completed structure of an embodiment of the present invention, wherein a MCT 10 chip which has double sided CdTe interdiffusion 12 for surface passivation is epoxy 26 mounted to a silicon ROIC 14. With reference to FIGS. 2a–2f, there is shown a method of forming an embodiment of the present invention which is shown in the completed structure of FIG. 1.

An overview of the process illustrated in FIGS. 2a–2f is as follows. FIG. 2a shows a layer of MCT 10 grown by Liquid Phase Epitaxy (LPE) on a cadmium zinc telluride (CZT) substrate 16. After preparation of the top surface of the MCT, the MCT is passivated by deposition of CdTe 12 as shown in FIG. 2b. FIG. 2c shows a second CZT 22 mounted with a high temperature adhesive 24 on the passivated surface of the MCT 10. The first CZT 16 is then removed and the bottom of the MCT 10 is passivated by deposition of CdTe 12 as shown in FIG. 2d. The structure shown in FIG. 2d is then placed in a high temperature anneal furnace such that both CdTe surfaces are interdiffused with the MCT. The MCT 10 which has now been passivated on both sides by deposition and interdiffusion of CdTe is prepared to be mounted to the ROIC by sawing it to the proper size. The MCT is epoxy 26 or otherwise mounted to the ROIC as shown in FIG. 2e. After removal of the second CZT 22 and the high temperature epoxy 24 the MCT as shown in FIG. 2f is ready for processing to create the FPA.

A detailed discussion of the process illustrated in FIGS. 2a–2f, a method and structure of a preferred embodiment, is given in the following paragraphs. A layer of MCT 10 is grown by Liquid Phase Epitaxy (LPE) on a cadmium zinc telluride (CZT) substrate 16 to a thickness of about 50 $\mu$m as shown in FIG. 2a. The top surface of the MCT is prepared for passivation by polishing to remove 8–10 $\mu$m of material using ¼% $Br_2$/MeOH. The MCT slice formed by LPE is preferably wax mounted to a silicon carrier, LPE side up, to facilitate processing. The MCT is further prepared for passivation by rinsing on a spinner.

The MCT is passivated by deposition of CdTe 12 as shown in FIG. 2b. Deposition is accomplished by evaporating 2000 Å of 30° C. CdTe onto the surface. In a preferred embodiment, the CdTe deposition on the MCT is followed by deposition of 3000 Å of sputtered ZnS 18. The purpose of the ZnS is to serve as an impurity/contaminant barrier layer to protect the CdTe during heat treatment. The MCT is then annealed to diffuse the CdTe into the MCT at preferably 250° C. The anneal may also be done together with the second anneal step below.

The MCT is prepared for adhesion to the temporary substrate, the second CZT. CZT chips of suitable size are prepared to mount to the MCT chips. CZT chips are preferably polished to insure flatness. The polished side is then coated with 5,000 Å of 180° C. Plasma $SiO_2$ 20. The $SiO_2$ is to prevent chemicals from attacking the CZT during polish of the MCT. The CZT chips are then baked under vacuum to prevent outgassing during interdiffusion.

FIG. 2c shows the second CZT 22 mounted with a high temperature adhesive 24 on the passivated surface of the MCT 10. The CZT is mounted with the polished $SiO_2$ coated side down on the ZnS/CdTe side of the MCT with a high temperature epoxy. The first CZT 16 is then removed by diamond point turning (DPT).

The bottom surface of the MCT 10 is prepared for deposition of CdTe 12. First, the MCT is diamond point turned to a preferable thickness of 25 $\mu$m, and then polished to within 15 to 17 $\mu$m while still on the DPT puck using ¼% $Br_2$/MeOH. The MCT is further thinned by bromine methanol spray. After rinsing to remove all Br/MeOH residues, a 2000 Å layer of 30° C. layer of CdTe is then evaporated on the MCT, followed by 3000 Å of sputtered ZnS 18. The MCT is then annealed for 4 days at 250° C. The completed MCT, after interdiffusion is shown in FIG. 2d.

The MCT 10 which has now been passivated by deposition and interdiffusion of CdTe on both sides is prepared to be mounted to the ROIC, MCT side down, after sawing it to the proper size. HCl spray may be used to remove the ZnS 18. The MCT is preferably epoxy 26 mounted to the ROIC as shown in FIG. 2e. After mounting to the ROIC, the second CZT 22 and the high temperature epoxy 24 must be removed. The greater part of the CZT is removed by DPT. Bromine methanol spray may be used to remove the remainder of the CZT. The $SiO_2$ and the high temperature epoxy can then be removed using reactive ion beam etching (RIE). HCl spray may be used to remove sputtered ZnS. The MCT is now as shown in FIG. 2f mounted to the ROIC and is ready for processing to create the FPA.

The process and structure of a second embodiment provides a single side passivated MCT mounted on a ROIC where the interdiffusion passivation is done prior to the mounting on the ROIC. This method has the advantage of reduced processing steps and does not require the high temperature bond for the MCT to the second carrier. This method also does not require the second carrier to have a matched coefficient of thermal expansion since it would not be necessary to subject the MCT slice to high temperature while affixed to the second carrier. This method would be especially useful when the diffusion regions of the diodes fabricated on the MCT do not extend to the bottom of the MCT layer. However, when the p-n junctions of the diodes "punch through" the MCT, extend fully through the MCT layer, this method may not adequately limit dark currents as discussed above due to the back side of the MCT and its associated p-n junction not being passivated. This method is generally less desirable because when the diodes don't "punch through" they have an increased p-n junction area which tends to increase dark currents.

The process steps to fabricate the structure of this second embodiment is essentially as discussed above, except as provided hereinbelow. A layer of MCT 10 is grown by Liquid Phase Epitaxy (LPE) on a cadmium zinc telluride (CZT) substrate 16 as shown in FIG. 2a. After preparation of the top surface of the MCT 10, the MCT is passivated by deposition of CdTe 12 as shown in FIG. 2b. In this embodiment, the MCT is interdiffused prior to being affixed to the second carrier. Mounting to the second carrier for this embodiment is the same as that shown in FIG. 2c except that the carrier need not be CZT 22 as shown. The second carrier can be chosen for the MCT independent of temperature concerns. The first CZT 16 is then removed. The MCT which has now been passivated on only one side is prepared to be mounted to the ROIC 14 by sawing it to the proper size, shown in FIG. 2e. The MCT 10 is epoxy mounted to the ROIC 14 and the second CZT and the epoxy are removed. This embodiment procedure creates a single side passivated MCT mounted on a ROIC where the interdiffusion passivation is done prior to the mounting on the ROIC.

Other embodiments of the present invention provide alternative mounting techniques for mounting the MCT to the second CZT. The bonding of the MCT to the second CZT should be able to withstand the high temperatures of interdiffusion, but it is only a temporary bond, one that will be removed subsequent to mounting the MCT to the ROIC. Other preferred methods for bonding include bump bonding the MCT with indium, and acid soluble epoxies. An additional embodiment of the present invention includes an $SiO_2$ layer applied to the top face of the second CZT prior to mounting to the MCT to protect the MCT from subsequent chemical polishing steps.

Yet another embodiment of the present invention substitutes germanium for the second CZT. Although the germanium is not as closely matched in coefficient of thermal expansion to the MCT, it is more chemically resistant to Br/MeOH. This removes the need for the $SiO_2$ protective layer.

The sole Table, below, provides an overview of some embodiments and the drawings.

TABLE

| Drawing Element | Preferred or Specific Examples | Generic Term | Other Alternate Examples |
|---|---|---|---|
| 10 | MCT (Mercury Cadmium Telluride) | Active Layer | |
| 12 | CdTe | Passivation Layer | |
| 14 | ROIC (Read Out Integrated Circuit) | Carrier Chip | |
| 16 | CZT (Cadmium Zinc Telluride) | LPE Growth Substrate | Germanium, Ceramic, Sapphire |
| 18 | ZnS | Protective Layer | |
| 20 | $SiO_2$ | Protective Layer | |
| 22 | CZT | Second Temporary Substrate | Germanium, Ceramic, Sapphire |
| 24 | High Temp. Epoxy | High Temp. Adhesive | Indium, Polyimide, Thermoplastics, Spin on glass |
| 26 | Epoxy | Adhesive | Thermoplastic Adhesives |

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of forming a focal plane array structure, said method comprising steps:
    (a) depositing a mercury cadmium telluride (MCT) layer outwardly of a first carrier material;
    (b) depositing a first passivation layer outwardly of said MCT layer from said first carrier material;
    (c) mounting a second carrier material outwardly of said first passivation layer from said first carrier material;
    (d) removing said first carrier material;
    (e) depositing a second passivation layer outwardly of said MCT layer from said first passivation layer such that said MCT layer is sandwiched between said first and said second passivation layers;
    (f) interdiffusing said first and second passivation layers with said MCT layer before mounting said sandwiched MCT layer to a readout integrated circuit;
    (g) using said second carrier material to mount said sandwiched MCT to said readout integrated circuit with said second passivation layer facing said readout integrated circuit; and
    (h) removing said second carrier material from said sandwiched MCT such that said sandwiched MCT remains on said readout integrated circuit.

2. The method according to claim 1, wherein said second carrier material is mounted to said first passivation layer using a material from the following group: high temperature epoxy, polyimide, thermoplastic and spin on glass.

3. The method according to claim 1, wherein said second carrier material has a closely matched coefficient of thermal expansion with said MCT.

4. The method according to claim 1, wherein said first carrier material is removed using a diamond point turning machine and said MCT layer is partially removed with said diamond point turning machine subsequent to removing said first carrier material.

5. The method according to claim 1, wherein an oxide is applied to said second carrier material on the surface to be mounted to said first carrier material to protect said MCT during subsequent processes such as removing said second carrier material.

6. A method of forming a focal plane array structure, said method comprising steps:
    (a) depositing a mercury cadmium telluride (MCT) layer outwardly of a first cadmium zinc telluride (CZT) substrate;
    (b) depositing a first cadmium telluride (CdTe) layer outwardly of said MCT layer from said first CZT substrate;
    (c) mounting a second CZT substrate outwardly of said first CdTe layer from said first CZT substate;
    (d) removing said first CZT substrate;
    (e) depositing a second CdTe layer outwardly of said MCT layer from said first CdTe layer such that said MCT layer is sandwiched between said first and said second CdTe layers;
    (f) interdiffusing said first and second CdTe layers with said MCT layer before mounting said sandwiched MCT layer to a readout integrated circuit;
    (g) using said second CZT substrate to mount said sandwiched MCT to said readout integrated circuit with said second CdTe layer facing said readout integrated circuit; and
    (h) removing said second CZT substrate from said sandwiched MCT such that said sandwiched MCT remains on said readout integrated circuit.

7. The method according to claim 6, wherein said second CZT substrate is mounted to said first CdTe layer using a material from the following group: high temperature epoxy, polyimide, thermoplastic and spin on glass.

8. The method according to claim 6, wherein said second CZT substrate has a closely matched coefficient of thermal expansion with said MCT.

9. The method according to claim 6, wherein said first CZT substrate is removed using a diamond point turning machine and said MCT layer is partially removed with said diamond point turning machine subsequent to removing said first CZT substrate.

10. The method according to claim 6, wherein an oxide is applied to said second CZT substrate on the surface to be mounted to said first CZT substrate to protect said MCT during subsequent processes such as removing said second CZT substrate.

* * * * *